(12) United States Patent
Ichiki et al.

(10) Patent No.: US 7,034,285 B2
(45) Date of Patent: Apr. 25, 2006

(54) BEAM SOURCE AND BEAM PROCESSING APPARATUS

(75) Inventors: Katsunori Ichiki, Fujisawa (JP); Akio Shibata, Fujisawa (JP); Akira Fukuda, Fujisawa (JP); Hirokuni Hiyama, Fujisawa (JP); Kazuo Yamauchi, Fujisawa (JP); Seiji Samukawa, Sendai (JP)

(73) Assignees: Ebara Corporation, Tokyo (JP); Tohoku University, Sendai (JP)

( * ) Notice: Subject to any disclaimer, the term of this patent is extended or adjusted under 35 U.S.C. 154(b) by 63 days.

(21) Appl. No.: 10/797,723

(22) Filed: Mar. 11, 2004

(65) Prior Publication Data
US 2004/0222367 A1    Nov. 11, 2004

(30) Foreign Application Priority Data
Mar. 14, 2003    (JP) ............................. 2003-071073

(51) Int. Cl.
*H05H 3/02*    (2006.01)
(52) U.S. Cl. .............. 250/251; 315/111.51; 315/111.81
(58) Field of Classification Search ................ 250/251, 250/423 R, 427, 492.21; 204/298.04; 315/111.21, 315/111.81
See application file for complete search history.

(56) References Cited

U.S. PATENT DOCUMENTS

| | | | |
|---|---|---|---|
| 4,158,589 A * | 6/1979 | Keller et al. ............ 156/345.46 |
| 4,450,031 A * | 5/1984 | Ono et al. .............. 156/345.39 |
| 4,486,665 A * | 12/1984 | Leung et al. ................ 250/427 |
| 4,898,557 A * | 2/1990 | Engemann .................... 445/49 |
| 5,216,330 A * | 6/1993 | Ahonen ................. 315/111.51 |
| 5,827,435 A | 10/1998 | Samukawa |
| 5,858,477 A * | 1/1999 | Veerasamy et al. ......... 427/562 |
| 5,883,470 A * | 3/1999 | Hatakeyama et al. ... 315/111.51 |
| 5,928,528 A | 7/1999 | Kubota et al. |
| 6,073,578 A * | 6/2000 | Shim et al. ................ 118/723 I |
| 6,076,483 A * | 6/2000 | Shintani et al. ...... 118/723 MA |
| 6,150,755 A * | 11/2000 | Druz et al. .............. 313/359.1 |

(Continued)

FOREIGN PATENT DOCUMENTS

WO    WO 01/06534    1/2001

(Continued)

OTHER PUBLICATIONS

J.M.E. Harper et al., "Low Energy Ion Beam Etching", J. Electrochem. Soc: Solid-State Science and Technology, vol. 128, No. 5, May 1981, pp. 1077-1083.

(Continued)

*Primary Examiner*—Nikita Wells
*Assistant Examiner*—Johnnie L Smith, II
(74) *Attorney, Agent, or Firm*—Westerman, Hattori, Daniels & Adrian, LLP

(57) ABSTRACT

A beam source has a plasma generating chamber and a gas inlet port for introducing a gas into the plasma generating chamber. The beam source includes a plasma generator for generating positive-negative ion plasma containing positive ions at a density of at least $10^{10}$ ions/cm$^3$ and negative ions from the gas. The beam source also includes a plasma potential adjustment electrode disposed in the plasma generating chamber and a grid electrode having a plurality of beam extraction holes formed therein. The beam extraction holes have a diameter of at least 0.5 mm. The beam source has a first power supply for applying a voltage of at most 500 V between the plasma potential adjustment electrode and the grid electrode.

24 Claims, 4 Drawing Sheets

U.S. PATENT DOCUMENTS

| | | | |
|---|---|---|---|
| 6,167,835 B1 * | 1/2001 | Ootera et al. | 118/723 E |
| 6,217,703 B1 | 4/2001 | Kitagawa | |
| 6,294,862 B1 * | 9/2001 | Brailove et al. | 313/363.1 |
| 6,331,701 B1 | 12/2001 | Chen et al. | |
| 6,346,768 B1 * | 2/2002 | Proudfoot | 313/359.1 |
| 6,392,187 B1 * | 5/2002 | Johnson | 219/121.43 |
| 6,512,333 B1 * | 1/2003 | Chen | 315/111.21 |
| 6,805,891 B1 * | 10/2004 | Vijayen et al. | 428/336 |
| 6,872,289 B1 * | 3/2005 | Mizuno et al. | 204/298.01 |
| 2004/0221815 A1 * | 11/2004 | Fukuda et al. | 118/723 I |

FOREIGN PATENT DOCUMENTS

WO     WO 02/078407     10/2002

OTHER PUBLICATIONS

Harold R. Kaufman, "Technology of ion beam sources used in sputtering", J. Vac. Sci. Technol. 15(2), Mar./Apr. 1978, pp. 272-276.

Shoji Kitamura, "Ion Engine (Direct Current Discharge Type)", J. Vac. Soc. Jpn. vol. 45, No. 4, 2002, pp. 329-335.

* cited by examiner

BEAM SOURCE AND BEAM PROCESSING APPARATUS

BACKGROUND OF THE INVENTION

1. Field of the Invention

The present invention relates to a beam source suitable for use in a manufacturing process of semiconductor integrated circuits, information storage media such as hard disks, fine optical elements, micromachines, and the like, and more particularly to a beam source for generating a beam having a low energy and a high ion current density from high-density plasma. The present invention also relates to a beam processing apparatus having such a beam source.

2. Description of the Related Art

In recent years, semiconductor integrated circuits, information storage media such as hard disks, fine optical elements, micromachines, and the like have been processed in highly fine patterns. In fields of processing such workpieces, attention has been attracted to use of a high-density energetic beam which is highly linear, i.e., highly directional, and has a relatively large beam diameter. For example, an energetic beam is applied to a workpiece to thereby deposit a film on the workpiece or etch the workpiece.

As beam sources of such energetic beams, there have been used beam generators which generate various kinds of beams including a positive ion beam, a negative ion beam, and a neutral particle beam. The positive ion beam, the negative ion beam, or the neutral particle beam is applied to a desired area of a workpiece from the beam source to thereby locally deposit a film on the workpiece, etch the workpiece, modify a surface of the workpiece, or join or bond parts of the workpiece together.

A positive ion beam source having a dual grid system and a positive ion beam source having a single grid system are disclosed by J. M. E. Harper, J. J. Cuomo, P. A. Leary, G. M. Summa, H. R. Kaufman, and F. J. Bresnock, "Low Energy Ion Beam Etching," J. Electorochem. Soc., SOLID-STATE SCIENCE AND TECHNOLOGY, 1981. According to Harper et al., a dual grid system can generate ion current densities of 0.5 mA/cm$^2$ with an acceleration voltage of 500 V However, ion current densities of only several hundredths milliamperes per square centimeter can be obtained with an acceleration voltage of 100 V or lower. Therefore, practical ion etching cannot be carried out with an acceleration voltage of 100 V or lower in a dual grid system.

According to Harper et al., a single grid system can generate ion current densities as high as 1 mA/cm$^2$ with an acceleration voltage as small as 20 V However, unless the diameters of beam extraction apertures are comparable to or less than the thickness of a plasma sheath for effective operation, an ion beam cannot be extracted efficiently in parallel trajectories. Since a grid used in the experimental procedure of Harper et al. had 100 lines per inch, the diameters of beam extraction apertures were less than 250 μm. This grid could be used only for 5 to 10 hour operation including several exposures to air.

Another positive ion beam source having a dual grid system is disclosed by Harold R. Kaufman, "Technology of ion beam sources used in sputtering," J. Vac. Sci. Technol., 15(2), 1978. According to Kaufman, since ion current densities are in inverse proportion to a square of a distance between grid electrodes, it is effective to reduce the distance between the electrodes to enhance ion current densities. However, reduction of the distance between the electrodes is limited to a certain extent because of deflection due to thermal expansion. Kaufman also discloses a method of inserting insulators in some portions of the grid electrodes when a beam diameter is increased. However, this method cannot achieve uniformity of ion current densities on a beam emission surface. Thus, it is difficult to put this method into practice in industrial processes including fine processing on silicon wafers, glass substrates, or the like.

A positive ion beam source having a triple grid system with a diameter of 450 mm is disclosed by Kitamura, "(Direct Current Discharge Type) Ion Engine," J. Vac. Soc. Jpn., Vol. 45, No. 4, pp. 329–335, 2002. According to Kitamura, beam extraction holes in grid electrodes have diameters of 1 to 2 mm, and the grid electrodes are made of Mo and Ti, which have a low sputtering yield and a small coefficient of thermal expansion. These electrodes are in the form of a bowl in order to release thermal expansion in one direction. Further, the grid electrodes are made of carbon in another example. Carbon has a lower sputtering yield than Mo or Ti, and a coefficient of thermal expansion can be made substantially zero. Thus, it is not necessary to form carbon electrodes into a bowl. According to Kitamura, a potential of a first grid electrode contacting a plasma, which is referred to as a screen electrode, is 1000 V, and a potential of a second grid electrode, which is referred to as an acceleration electrode, is −200 V.

Extraction of ions from a positive ion beam source is discussed by Japanese laid-open patent publication No. 2001-28244, which was filed by the inventors of the present application. In order to efficiently extract ions with a dual grid system, grid electrodes should be designed so that a distance between the grid electrodes is substantially equal to the length of an ion sheath and that the diameters of beam extraction holes in the grid electrodes should be smaller than the distance between the grid electrodes.

The following beam source is disclosed by Japanese laid-open patent publication No. 2001-28244. High-density plasma is generated between two electrodes and spread through a mesh electrode, which is a second upstream electrode, mainly by diffusion. While the electron temperature of the plasma is lowered, downflow plasma is generated between the second electrode and a third electrode. When a negative gas is used, positive-negative ion plasma is generated. When a noble gas such as argon which is unlikely to generate negative ions is used, the plasma density is simply lowered. Ions are accelerated by an electric field produced by a voltage applied between the second and third electrodes. Thus, it is possible to generate high-density plasma. However, the plasma density is lowered so that the sheath length is as long as 1 mm at an upstream side of an electrode for extracting a beam. It is possible to extract a beam from the grid electrode including beam extraction holes having a diameter of 1 mm, which can be readily manufactured. However, this beam source cannot necessarily positively extract a high-density beam.

A negative ion beam source is disclosed by U.S. Pat. No. 5,928,528. This negative ion beam source generates high-density plasma from a negative gas such as halogen or oxygen and converts ions into reactive radicals by recombination of positive ions with electrons while generated ions are transported through a transportation pipe to a plasma chamber. The reactive radicals pass through a large number of holes formed in a plate made of metal. Negative ions are generated by charge exchange between an inner metal surface of the holes and the reactive radicals when the reactive radicals pass through the holes. The negative ions are accelerated by a grid electrode and applied to a workpiece.

However, reactive radicals such as halogen or oxygen have a function to corrode metals. Thus, metals which can be used for the electrodes are practically limited to gold, platinum, silver, ruthenium, rhodium, palladium, osmium, and iridium. Even if these metals are used, corrosion and oxidization cannot completely be eliminated. Thus, these metals are consumable. However, since these metals are expensive, cost of a beam source is further increased when a beam diameter is increased to process wafers having a diameter of 10 inches. Thus, these metals cannot practically be used as industrial materials for the electrodes.

Another negative ion beam source is disclosed by U.S. Pat. No. 4,158,589. This negative ion beam source basically has a dual grid system. In order to accelerate negative ions, a voltage is applied between two grid electrodes having beam extraction holes in the form of slits. A magnetic field of about 1000 gauss (0.1 T) is vertically applied in a direction across the slits of the grid electrodes in a plasma generating chamber, i.e., in a direction in which a beam is emitted. By using a difference between Larmor radii of negative ions and electrons, the negative ions pass through the grid electrode so as to be applied to a workpiece while the electrons are trapped.

A plasma generator described by U.S. Pat. No. 4,158,589 does not generate high-density plasma, i.e., plasma having a positive ion density of $10^{11}$ ions/cm$^3$. Although an adjustable voltage can be applied between two electrodes downstream of the plasma generator, a high voltage of 1000 V is applied in the embodiments. Specifically, U.S. Pat. No. 4,158,589 merely discloses that electrons are trapped so as to selectively apply only negative ions to a workpiece. The plasma density is low, and a voltage for accelerating ions is as high as about 1000 V. This beam source produces patterns having a narrow width and may cause damage to the workpiece. Thus, U.S. Pat. No. 4,158,589 does not disclose that a beam is efficiently accelerated at a high speed to process, for example, semiconductor LSIs. More specifically, a beam having a low energy and a high ion current density from high-density plasma is not taught or suggested by U.S. Pat. No. 4,158,589.

A neutral particle beam source is disclosed by U.S. Pat. No. 6,331,701. This neutral particle beam source generates a neutral particle beam having a low energy of 20 to 400 eV from high-density plasma. The beam source has a single grid system including a grid electrode made of aluminum. When an oxygen gas is introduced to generate plasma, a native oxide is formed on the grid electrode made of aluminum. Since a surface of the grid electrode is thus insulated by a dielectric film, ions are accelerated by a self-bias voltage produced between the grid electrode and an acceleration electrode when a high-frequency voltage is applied to the grid electrode. The generated plasma is composed of positive ions and heated electrons which coexist therein. Therefore, when an ion beam having a low energy of 100 eV is extracted from high-density plasma of $10^{11}$ ions/cm$^3$, the length of an ion sheath becomes as short as about 0.5 mm. The diameters of beam extraction holes formed in the grid electrode are made smaller than the ion sheath length of, for example, 0.13 mm, because ions cannot efficiently be extracted in parallel without this configuration as described by Harper et al.

However, it is difficult to form fine holes having a diameter of 0.13 mm in the grid electrode. Further, the beam extraction holes should have an aspect ratio as high as about 10 in order to convert ions into a neutral particle beam. Therefore, fine holes are formed in an aluminum plate by dry etching. Thus, the beam extraction holes should have a diameter smaller than the length of the ion sheath in order to efficiently extract a low-energy beam from high-density plasma and should have an aspect ratio of 10 in order to convert ions into a neutral particle beam. Accordingly, the grid electrode has a thickness as thin as 1.6 mm. As a result, the grid electrode cannot maintain a mechanical strength and has a difficulty in handling. In particular, when the diameter of the beam source is increased to 10 inches or more, the grid electrode may be deflected by thermal expansion. Thus, it is difficult to put this neutral particle beam source into industrial practice.

A neutral particle beam processing apparatus is disclosed by Japanese laid-open patent publication No. 2002-289581, which was filed by the inventers of the present application. This neutral particle beam processing apparatus generates a positive-negative ion plasma by pulse modulation of high frequency, then accelerates generated negative ions to a grid electrode, which is referred to as an orifice electrode, with a single or dual grid system, and converts the negative ions into a neutral particle beam when the negative ions pass through beam extraction holes in the grid electrode.

Extraction of an ion beam from plasma is disclosed by Ishikawa, "Ion Source Engineering," Ionics Co. Ltd., pp. 177–179, 1986 and U.S. Pat. No. 5,827,435. According to Ishikawa and U.S. Pat. No. 5,827,435, plasma is generated by application of a high-frequency voltage. When the application of a high-frequency voltage is interrupted, the electron temperature is lowered so that electrons are attached to a residual gas to form negative ions. Thus, the application of a high-frequency voltage and the interruption of the high-frequency voltage are alternately repeated to generate positive and negative ions. In order to accelerate positive ions and negative ions alternately toward a workpiece or collide the positive ions and negative ions alternately with the workpiece, positive and negative DC bias voltages may alternately be applied to a workpiece, or a high frequency of about 400 kHz may be applied to the workpiece.

For mass production and reduction in cost of semiconductor integrated circuits, fabrication apparatuses for semiconductor integrated circuits should be capable of processing workpieces having larger diameters. When the diameter of a conventional ion beam source is increased so as to generate various kinds of beams including a positive ion beam, a negative ion beam, and a neutral particle beam, the following problems arise.

In order to obtain a high ion current density, an ion beam source having a dual grid system should have a shorter distance between grid electrodes because current densities of ions to be extracted are in inverse proportion to a square of a distance between the grid electrodes and in direct proportion to an extraction voltage to the three halves power as described by Harper et al. In order to obtain a maximum saturation ion current density, the distance between the electrodes should be approximately equal to or slightly shorter than the sheath length, and the diameters of the beam extraction holes should be approximately equal to the distance between the electrodes as described by Ishikawa.

In a conventional ion beam source having a dual grid system, the distance between the electrodes and the diameters of the beam extraction holes can be made long or large because the ion beam source has a low plasma density. In generally used plasma which is composed of positive ions and heated electrons which coexist therein, when the extraction voltage is as low as 100 V and the high-density plasma has a positive ion density of $10^{11}$ ions/cm$^3$, the sheath length becomes as short as about 0.5 mm.

The sheath length s is expressed by $$s[m] = 0.585\lambda_D \left(\frac{2V_0}{kT_e}\right)^{\frac{3}{4}}$$

where $T_e$ is the electron temperature, $\lambda_D$ is the Debye length, and $V_0$ is the sheath potential [V]. The Debye length $\lambda_D$ is expressed by $$\lambda_D[m] = \sqrt{\frac{\varepsilon_0 kT_e}{e^2 n_i}} = 7.43 \times 10^3 \sqrt{\frac{kT_e \text{ [eV]}}{n_i \text{ [m}^{-3}\text{]}}}$$

where $\varepsilon_0$ is the permittivity of empty space, and $n_i$ is the plasma density.

It is practically difficult to provide an ion beam source which can obtain a high ion current density from this plasma because the diameters of the beam extraction holes and the distance between the electrodes become extremely small or short. Even if such an ion beam source can be provided, the grid electrodes are deflected because they are as thin as at most 0.5 mm. In order to solve such drawbacks, the grid electrodes may be fixed at some portions by pins of ceramic insulators. As described by Harper et al., while such a method can be applied to an ion engine, the uniformity of a beam becomes worse in a case where such a method is employed for semiconductor fabrication apparatuses. There has been known to curl electrodes made of molybdenum or titanium in the form of a bowl in order to maintain the distance between the electrodes by deflection of the electrodes in the same direction. However, with this method, when beam extraction holes in the grid electrodes have a high aspect ratio, e.g., a diameter of 0.13 mm and a length of 1.6 mm, a beam cannot be emitted in parallel without divergence because the grid electrodes are curled. The drawbacks on deflection can be solved if grid electrodes are made of a graphite material, which has a small coefficient of linear expansion. However, since the graphite material is frangible, such electrodes may be broken in handling. Further, when the beam extraction holes have a small diameter, it is difficult to align the beam extraction holes of the respective grid electrodes with each other.

An ion beam source having a single grid system disclosed by Harper et al. can achieve a saturation ion current density with a low extraction voltage. For this purpose, the ion extraction holes should have a diameter smaller than the sheath length. When the plasma density is as high as about $10^{11}$ ions/cm$^3$, the sheath length is as short as about 0.5 mm. Therefore, the ion extraction holes should have a diameter of about 0.1 mm. In order to efficiently extract ions, the electrode should be thin in the same manner as the diameter of the ion extraction holes. However, a thin electrode has a short lifetime because it is sputtered by accelerated ions. In an acceleration device disclosed by U.S. Pat. No. 6,331,701, electrodes are similarly sputtered by accelerated ions.

As described above, the conventional ion beam sources cannot generate an ion beam having a low energy of at most 500 V, preferably at most 200 V, and a high ion current density from high-density plasma. Therefore, in industrial processes, a high etching rate cannot practically be achieved with use of an ion beam having a high ion current density and a low energy.

Further, a reactive ion etching (RE) process has been widely employed in various industrial fields of fine processing. In particular, positive-negative ion plasma as described by U.S. Pat. Nos. 5,928,528 and 5,827,435 is advantageous in that charge build-up damage and microloading effect can be prevented unlike plasma composed of positive ions and electrons. However, a grid electrode is not disposed between plasma and a workpiece unlike a beam source. Thus, a workpiece is exposed directly to the plasma. Therefore, an undesired film adversely deposits on a surface or a side surface of the workpiece due to unnecessary exposure of the workpiece to radicals, or a vacuum ultraviolet (VUV) emitted from the plasma is applied to the workpiece so as to cause semiconductor devices formed on the workpiece to be damaged.

SUMMARY OF THE INVENTION

The present invention has been made in view of the above drawbacks. It is, therefore, an object of the present invention to provide a beam source and a beam processing apparatus which can uniformly apply various kinds of beams including a positive ion beam, a negative ion beam, and a neutral particle beam at a high ion current density with a low energy, can increase the diameter of a grid electrode, and can prolong a lifetime of the grid electrode.

More specifically, semiconductor integrated circuits, hard disks, and the like are industrially required to be produced at low cost. Thus, a beam source should be designed so as to generate a beam having a high ion current density, achieve a high processing rate, and process a large number of workpieces at a time. Further, a grid electrode to extract ions should not cause any damage to circuits and crystal structures formed in the workpiece. The beam source is required to be operated at a low voltage of at most 500 V, preferably at most 100 V, which can easily be handled. Since a grid electrode is ablated most intensively in a beam source, it is desired, to prolong a lifetime of such a grid electrode.

According to a first aspect of the present invention, there is provided a beam source having a plasma generating chamber and a gas inlet port for introducing a gas into the plasma generating chamber. The beam source includes a plasma generator for generating positive-negative ion plasma containing positive ions at a density of at least $10^{10}$ ions/cm$^3$ and negative ions from the gas. The beam source also includes a plasma potential adjustment electrode disposed in the plasma generating chamber and a grid electrode having a plurality of beam extraction holes formed therein. The beam extraction holes have a size of at least 0.5 mm. The beam source has a first power supply for applying a voltage of at most 500 V between the plasma potential adjustment electrode and the grid electrode. Preferably, the density of the positive ions should be at least $10^{11}$ ions/cm$^3$, the voltage to be applied should be at most 200 V, and the size of the beam extraction holes should be at least 1 mm.

The positive-negative ion plasma is defined as a mixed state having substantially the same densities of positive ions and negative ions. Some electrons may be mixed with the positive-negative ion plasma. The positive-negative ion plasma may not maintain the above mixed state continuously. Specifically, the above mixed state and a plasma state composed of positive ions and electrons may be alternately repeated. For example, plasma composed of positive ions and electrons may be formed for 10 microseconds, and then electrons may be attached to a residual gas for 100 microseconds to form positive-negative ion plasma.

The plasma potential adjustment electrode is defined as an electrode to provide a certain potential to the positive-negative ion plasma with respect to the grid electrode. The beam extraction holes may have circular shapes or polygonal shapes. The size of the beam extraction hole is defined as the diameter of a circular when the beam extraction hole has a circular shape, or as the longest distance between vertexes when the beam extraction hole has a polygonal shape. Further, the density of particles in a neutral particle beam is also expressed as the ion current density. Thus, the ion current density is also referred to so as to express the density of particles in a neutral particle beam.

According to a preferred aspect of the present invention, the plasma generator has a coil disposed near the plasma generating chamber and a second power supply for intermittently supplying a high-frequency current to the coil.

According to a second aspect of the present invention, there is provided a beam source having a plasma generating chamber and a gas inlet port for introducing a gas into the plasma generating chamber. The beam source includes a plasma generator for generating positive-negative ion plasma containing positive ions and negative ions from the gas, and a plurality of grid electrodes each having a plurality of beam extraction holes formed therein. The beam source also includes a first power supply for applying a voltage between the plurality of grid electrodes to accelerate the positive ions or the negative ions so as to pass through the beam extraction holes formed in the grid electrodes and to extract a neutralized beam from the positive ions or the negative ions or an ion beam.

According to a preferred aspect of the present invention, the plasma generator has a coil disposed near the plasma generating chamber and a second power supply for intermittently supplying a high-frequency current to the coil.

According to a preferred aspect of the present invention, the beam source also has a plasma potential adjustment electrode disposed in the plasma generating chamber. The first power supply applies a voltage between the plasma potential adjustment electrode and at least one of the grid electrodes.

A conventional beam source generates plasma having a high positive ion density of $1 \times 10^{11}$ ions/cm$^3$, which is mainly composed of positive ions and electrons. Therefore, when the extraction voltage is as low as 100 V, the sheath length is as short as 0.5 mm. Thus, ions cannot be extracted without a grid electrode including beam extraction holes having a diameter of at most 0.1 mm.

The sheath length is expressed by $$s[m] = 0.585 \lambda_D \left( \frac{2V_0}{kT_e} \right)^{\frac{3}{4}}$$

where $T_e$ is the electron temperature, $\lambda_D$ is the Debye length, and $V_0$ is the sheath potential [V]. The Debye length $\lambda_D$ is expressed by $$\lambda_D[m] = \sqrt{\frac{\varepsilon_0 k T_e}{e^2 n_i}} = 7.43 \times 10^3 \sqrt{\frac{kT_e \; [\text{eV}]}{n_i \; [\text{m}^{-3}]}}$$

where $\varepsilon_0$ is the permittivity of empty space, and $n_i$ is the plasma density.

There is a proper aspect ratio of the beam extraction holes in the grid electrode in view of processing requirements. The grid electrode should have a mechanical strength to a certain extent under thermal influence in operation of the beam source. It is difficult to increase the diameter of the grid electrode when the diameters of the beam extraction holes in the grid electrode are small.

According to the present invention, positive-negative ion plasma composed of positive ions and negative ions can be formed so as to lengthen the sheath length. Thus, an ion beam can efficiently be extracted from beam extraction holes having a relatively large diameter. An electrode including beam extraction holes having a diameter of at least 0.5 mm, preferably at least 1 mm, can be formed of metal or carbon by drilling, isotropic wet-etching, or relatively inexpensive processes such as extrusion molding. Since the grid electrode can be made as thick as 10 mm, the diameter of the grid electrode can be increased, and a lifetime of the grid electrode can be prolonged.

Since the beam extraction holes of the beam source according to the present invention have a large diameter, the beam extraction holes of the grid electrodes may be shifted within a relatively large allowable range. Thus, positioning of the grid electrodes can easily be performed.

According to a preferred aspect of the present invention, the first power supply applies a low voltage such that accelerated ions do not practically sputter the at least one of the grid electrodes.

According to a preferred aspect of the present invention, the pluralities of beam extraction holes in the plurality of the grid electrodes are aligned with the plurality of beam extraction holes in the other of the grid electrodes. As a result, ablation of the grid electrode is remarkably reduced, and the beam source can be operated for a long term.

A voltage is applied between the plasma potential adjustment electrode and the grid electrode contacting the plasma to accelerate positive ions or negative ions as a saturation ion current toward a plurality of grid electrodes, e.g. two grid electrodes. The ion current density of accelerated ions hardly depends on a voltage to be applied. A maximum saturation ion current is accelerated toward the grid electrodes. The voltage to be applied can be set to be a low voltage of, for example, 50 V so that the grid electrode is not subjected to adverse influence such as a shortened lifetime by sputtering. A voltage is applied between the two grid electrodes to accelerate ions, so that the energy of the ions can be controlled at a desired kinetic energy. For example, a voltage of 200 V is applied to accelerate ions. Thus, an ion beam having a kinetic energy of about 200 eV can be emitted at a high ion current density. The grid electrode is not practically sputtered, and the lifetime of the grid electrode can be prolonged.

According to a preferred aspect of the present invention, the plurality of beam extraction holes in at least one of the grid electrodes has an aspect ratio of at least 10. The aspect ratio is defined as a ratio of a length of a hole to a diameter of the hole.

When the aspect ratio is at least 10, accelerated ions are neutralized when they pass through the grid electrode. Thus, a neutral particle beam is emitted to a workpiece. In a conventional neutral particle beam having a single grid system, the grid electrode is sputtered as discussed by U.S. Pat. No. 6,331,701. According to the present invention, sputtering can be prevented. Three electrodes are employed in Japanese laid-open patent publication No. 2001-28244. High-density plasma is spread through a mesh electrode, which is a second upstream electrode, by diffusion. While the electron temperature of the plasma is lowered, downflow plasma is generated between the second electrode and a third electrode. When a negative gas is used, positive-negative ion plasma is generated. When a noble gas such as argon which is unlikely to generate negative ions is used, the plasma density is simply lowered. Ions are accelerated by an electric field produced by a voltage applied between the second and third electrodes. Thus, it is possible to generate high-density plasma. However, the plasma density is lowered at an upstream side of an electrode for extracting a beam. It is possible to extract a beam from a grid electrode including beam extraction holes having a diameter of 1 mm. However, this beam source cannot necessarily positively extract a high-density beam. The beam source according to the present invention is practically advantageous as a high-density beam source having a low energy in that it draws ions from the high-density plasma directly to the grid electrode.

According to a third aspect of the present invention, there is provided a beam processing apparatus having a vacuum chamber, a holder disposed in the vacuum chamber for holding a workpiece, and the aforementioned beam source for applying a beam to the workpiece held by the holder. With this beam processing apparatus, various kinds of beams including a neutral particle beam can be applied to a workpiece at a high ion current density with a low energy and a large diameter. Therefore, no charge build-up or damage is caused to the workpiece.

The above and other objects, features, and advantages of the present invention will be apparent from the following description when taken in conjunction with the accompanying drawings which illustrate preferred embodiments of the present invention by way of example.

DETAILED DESCRIPTION OF THE PREFERRED EMBODIMENTS

Figure 1A:
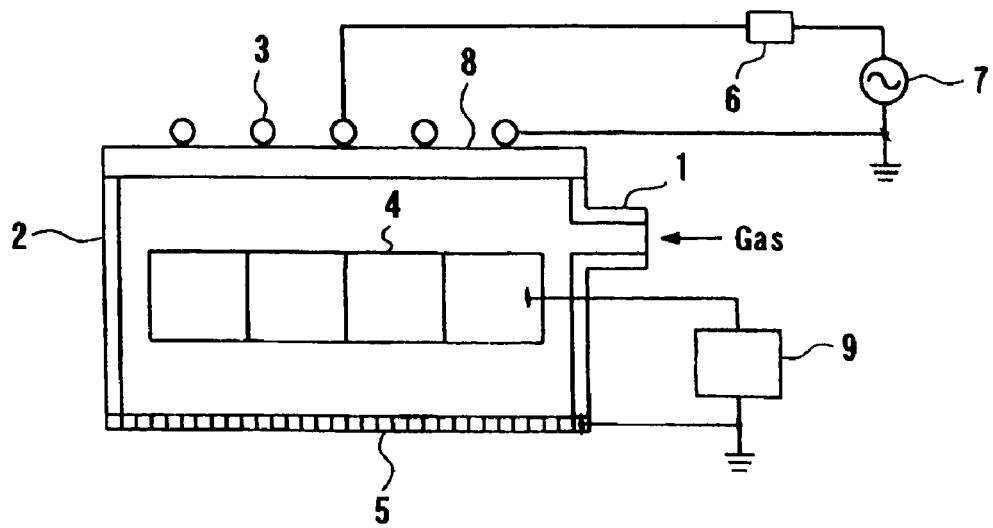
FIG. 1A is a schematic view showing a beam source according to a first embodiment of the present invention.

A beam source and a beam processing apparatus according to embodiments of the present invention will be described below with reference to FIGS. 1A through 7. Like or corresponding parts are denoted by like or corresponding reference numerals throughout drawings, and will not be described below repetitively.

FIG. 1A is a schematic view showing a beam source according to a first embodiment of the present invention. As shown in FIG. 1A, the beam source has a plasma generating chamber 2 made of quartz glass for generating a plasma, a quartz glass plate 8 disposed on an upper end of the plasma generating chamber 2, a coil 3 disposed on an upper surface of the quartz glass plate 8 for inductively coupled plasma (ICP), and a high-frequency power supply 7 electrically connected to the coil 3. The beam source includes a plasma potential adjustment electrode 4 made of metal, a grid electrode 5 disposed on a lower end of the plasma generating chamber 2, and a DC bias power supply 9 electrically connected to the plasma potential adjustment electrode 4 and the grid electrode 5. The plasma generating chamber 2 has a gas inlet port 1 for introducing a gas into the plasma generating chamber 2.

In the present embodiment, the coil 3 is in the form of a spiral. For example, the coil 3 comprises a water-cooled copper pipe having an outside diameter of about 8 mm. The coil 3 is electrically connected via a matching box 6 to the high-frequency power supply 7, which applies a high-frequency voltage having a frequency of, for example, about 13.56 MHz to the coil 3.

For example, an $SF_6$ gas is introduced through the gas inlet port 1 into the plasma generating chamber 2. The flow rate of the $SF_6$ gas is adjusted by a mass flow controller (not shown) so that the pressure in the plasma generating chamber 2 becomes 1 Pa. When a high-frequency current is supplied from the high-frequency power supply 7 via the matching box 6 to the coil 3, an induced magnetic field is produced in the plasma generating chamber 2 by the coil 3. The varying magnetic field induces an electric field, which accelerates electrons and ionizes atoms and molecules in the gas to generate plasma in the plasma generating chamber 2. The generated plasma is mainly composed of positive ions and heated electrons which coexist therein. Thus, the coil 3, the matching box 6, and the high-frequency power supply 7 form a plasma generator for generating plasma in the plasma generating chamber 2.

Figure 1B:
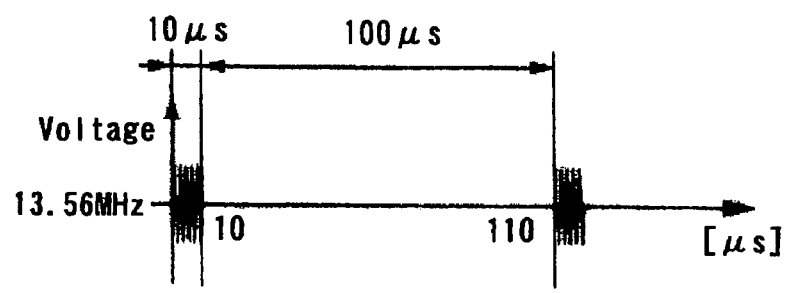
FIG. 1B is a graph showing intermittent supply of a high-frequency current.

As shown in FIG. 1B, for example, a high-frequency voltage having a frequency of about 13.56 MHz is applied to the coil 3 for 10 microseconds by the high-frequency power supply 7, so that a high-frequency electric field is produced in the plasma generating chamber 2. Then, the high-frequency voltage applied by the high-frequency power supply 7 is interrupted for 100 microseconds. Thereafter, a high-frequency voltage is applied again to the coil 3 for 10 microseconds by the high-frequency power supply 7 to heat electrons in the plasma within the plasma generating chamber 2. Thus, the above cycle is repeated to intermittently supply a high-frequency current to the coil 3. In this manner, the application of the high-frequency voltage for 10 microseconds and the interruption of the high-frequency voltage for 100 microseconds are alternately repeated. The period of time (100 microseconds) for which the high-frequency voltage is interrupted is sufficiently longer than a period of time in which electrons in the plasma are attached to the residual gas to generate negative ions, and sufficiently shorter than a period of time in which the electron density in the plasma is lowered to extinguish the plasma. The period of time (10 microseconds) for which the high-frequency voltage is applied is long enough to recover the energy of electrons in the plasma which has been lowered during the interruption of the high-frequency voltage.

The interruption of the high-frequency voltage after the energy of electrons in the plasma is increased allows negative ions to be generated efficiently and continuously. While ordinary plasma is mostly composed of positive ions and electrons, the beam source according to the present embodiment can efficiently generate plasma in which positive ions and negative ions coexist. Although the high-frequency voltage is interrupted for 100 microseconds in the example shown in FIG. 1B, it may be interrupted for a period of time ranging from 50 to 100 microseconds to generate a large quantity of negative ions as well as positive ions in the plasma.

As described above, the grid electrode 5 is disposed on the lower end of the plasma generating chamber 2. The grid electrode 5 is made of an electrically conductive material such as graphite and electrically grounded. The grid electrode 5 has beam extraction holes formed therein. The beam extraction holes may have circular shapes or polygonal shapes such as an equilateral triangle. For example, the beam extraction holes have a diameter of 1 mm and are arranged at pitches of 1.34 mm in the grid electrode 5. The grid electrode 5 has a thickness of 1 mm. When a high-frequency voltage having an electric power of 800 W is continuously applied to the coil 3, the plasma density of positive ions in the generated plasma becomes as high as $10^{11}$ ions/cm$^3$. Specifically, high-density plasma is generated. When pulse modulation is performed on the high-frequency voltage, the density of negative ions is increased substantially up to that of the positive ions while the density of the positive ions is substantially maintained. Thus, it is possible to generate high-density positive-negative ion plasma in which positive ions and negative ions coexist.

Figure 1C:
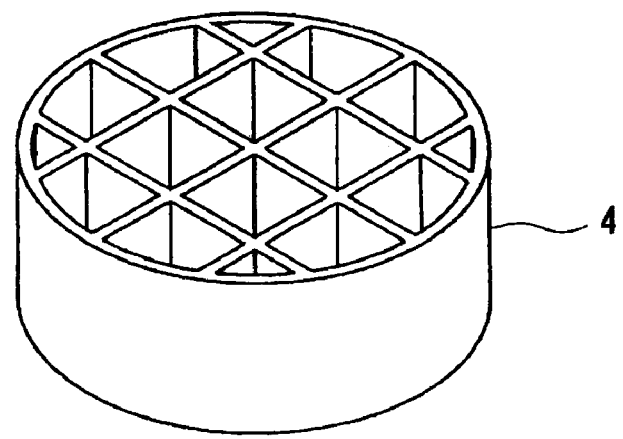
FIG. 1C is a perspective view showing a plasma potential adjustment electrode in the beam source shown in FIG. 1A.

When a positive voltage is applied to the plasma potential adjustment electrode 4 while positive ion plasma is generated by continuous discharge, the plasma potential becomes substantially equal to a potential of the plasma potential adjustment electrode 4. FIG. 1C is a perspective view of the plasma potential adjustment electrode 4. For example, when a voltage of +100 V is applied to the plasma potential adjustment electrode 4 by the DC bias power supply 9, the plasma potential is increased to +100 V. Thus, a sheath is produced right above the grid electrode 5 having a ground potential. Positive ions are accelerated by the sheath. However, because the length of the sheath is as short as 0.5 mm, it is difficult to emit a beam through the beam extraction holes having a diameter of 1 mm. If positive-negative ion plasma is generated by pulse modulation of the high-frequency voltage applied to the coil 3, the sheath is lengthened because such positive-negative ion plasma has a low electron density. Finally, the sheath is eliminated so as to form a gentle potential gradient between the plasma potential adjustment electrode 4 and the grid electrode 5. As a result, high-density ions generated in the positive-negative ion plasma are accelerated by an electric field between the electrodes 4 and 5 so as to travel linearly toward the grid electrode 5. Thus, the high-density ions are extracted through the beam extraction holes in the grid electrode 5. In this manner, with use of the positive-negative ion plasma as high-density plasma, a high-density beam having a low energy can be extracted from the plasma. If a negative potential is applied to the plasma potential adjustment electrode 4, then it is possible to accelerate negative ions and extract a negative ion beam.

In the present embodiment, it is desirable to introduce a gas that is likely to generate negative ions, such as $O_2$, $Cl_2$, $SF_6$, $CHF_3$, or $C_4F_8$, into the plasma generating chamber 2 so as to generate negative ions in the plasma. When the application of the high-frequency voltage is interrupted after high-density plasma is generated by the aforementioned high-frequency inductive coupling (ICP) with use of the above gas, a large number of negative ions can be generated in the plasma. Thus, positive-negative ion plasma can readily be generated.

Figure 2:
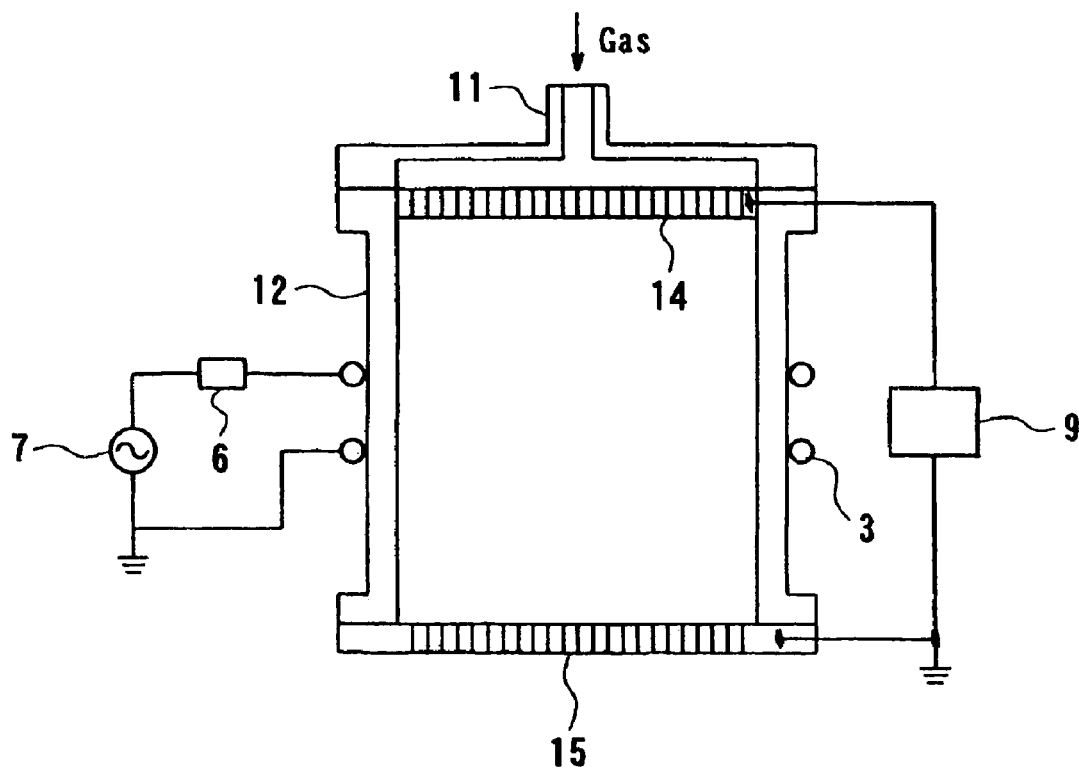
FIG. 2 is a schematic view showing a beam source according to a second embodiment of the present invention.

In the first embodiment, the plasma potential adjustment electrode 4 is disposed at a lower portion of the plasma generated in the plasma generating chamber 2. FIG. 2 is a schematic view showing a beam source according to a second embodiment of the present invention. The beam source in the second embodiment has a plasma generating chamber 12 for generating plasma between a plasma potential adjustment electrode 14 and a grid electrode 15. In the second embodiment shown in FIG. 2, a gas is introduced from a gas inlet port 11 through holes formed in the plasma potential adjustment electrode 14 into the plasma generating chamber 12. However, the plasma potential adjustment electrode 14 may have no holes formed therein, and the plasma generating chamber 12 may be made of glass with a gas inlet port for introducing a gas into the plasma generating chamber 12.

Figure 3:
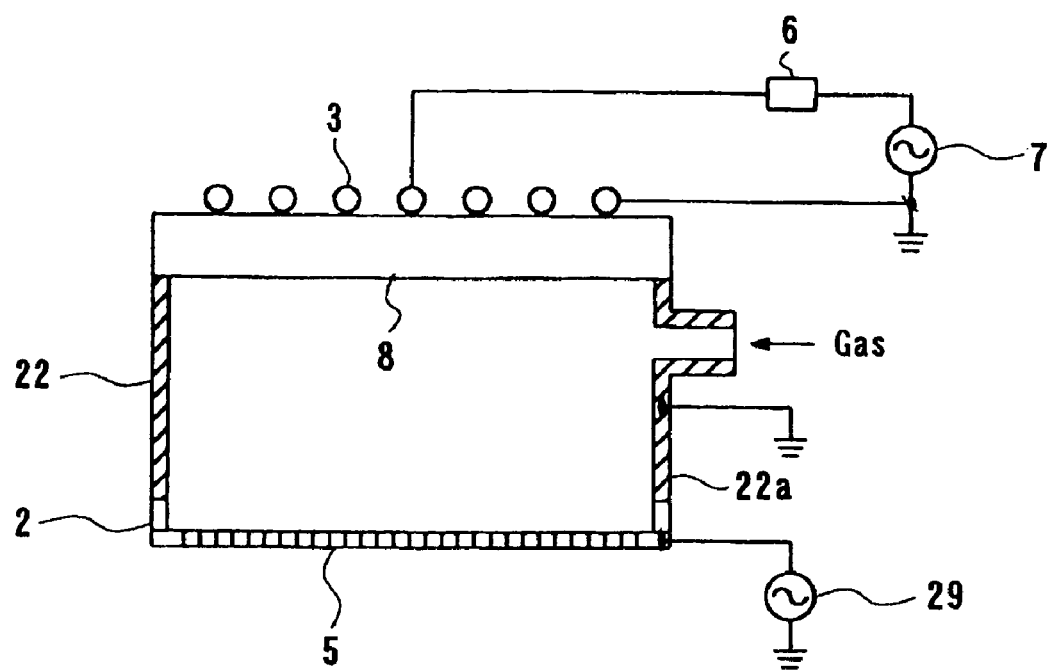
FIG. 3 is a schematic view showing a beam source according to a third embodiment of the present invention.

FIG. 3 is a schematic view showing a beam source according to a third embodiment of the present invention. In the first and second embodiments, the plasma potential adjustment electrode is disposed in the plasma generating chamber. However, the beam source in the third embodiment has a plasma generating chamber 22 made of metal so that walls 22a of the plasma generating chamber 22 serve as a plasma potential adjustment electrode.

A DC voltage may be applied between the plasma potential adjustment electrode 22a and the grid electrode 5. Alternatively, a high-frequency voltage having a frequency of about 600 kHz may be applied between the plasma potential adjustment electrode 22a and the grid electrode 5. Specifically, an AC power supply 29 may be connected between the plasma potential adjustment electrode and the grid electrode 5. When the frequency of the high-frequency voltage is sufficiently lower than the frequency of the ion plasma, then positive ions and negative ions can follow the high-frequency voltage, so that the positive ions and the negative ions can be alternately extracted. As a matter of course, a positive-negative pulsed DC voltage may be applied between the plasma potential adjustment electrode 22a and the grid electrode 5.

Figure 4:
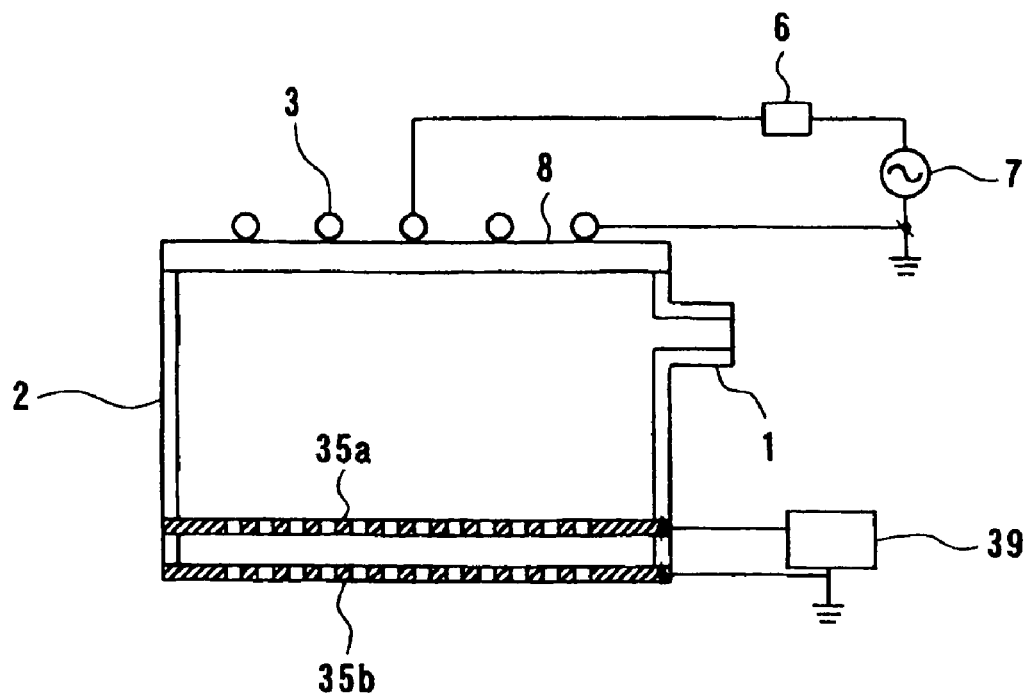
FIG. 4 is a schematic view showing a beam source according to a fourth embodiment of the present invention.

FIG. 4 is a schematic view showing a beam source according to a fourth embodiment of the present invention. The beam source in the fourth embodiment has two grid electrodes 35a and 35b. The grid electrodes 35a and 35b are disposed in parallel to and adjacent to each other and electrically connected to a DC power supply 39. The grid electrodes 35a and 35b have beam extraction holes having a diameter of, for example, 1 mm. The beam extraction holes are arranged at pitches of 1.34 mm in the grid electrodes 35a and 35b, respectively. The beam extraction holes in the respective grid electrodes 35a and 35b are aligned with each other. The grid electrodes 35a and 35b are spaced at a distance of 1 mm. A voltage of 100 V is applied between the grid electrodes 35a and 35b.

In order to extract a beam from plasma, high-density plasma, which is composed of positive ions and heated electrons, having a positive ion density of $10^{11}$ ions/cm$^3$ is generated in the plasma generating chamber 2. In this case, because the distance between the grid electrodes 35a and 35b is about two times the sheath length, the current density of ions which can be extracted is as low as about one fourth of the saturation ion current density. However, when positive-negative ion plasma, in which positive ions and negative ions coexist, is generated, the sheath length is lengthened or the sheath is eliminated. Thus, the current density of ions to be extracted does not depend largely on the voltage applied between the two grid electrodes 35a and 35b, but depends on an incident frequency Γ that ions randomly traveling in the plasma generating chamber 2 rush into the grid electrodes 5a and 5b per unit area and per unit time. The incident frequency Γ is expressed by $$\Gamma = \frac{1}{4} n_i \bar{v} \ [\text{ions} \cdot \text{cm}^{-2} \cdot \text{s}^{-1}]$$

where $\bar{v}$ is an average thermal velocity of ions and is expressed by $$\bar{v} = \sqrt{\frac{\pi m_i}{8 k T_i}} \ [\text{m/s}]$$

Since the ion temperature $T_i$ is substantially constant and a room temperature, the ion current density depends only on the density of the ions, i.e. the plasma density. Therefore, if high-density plasma is generated, it is possible to generate a beam having a high ion current density which depends only on a voltage applied between the two grid electrodes 35a and 35b.

Figure 5:
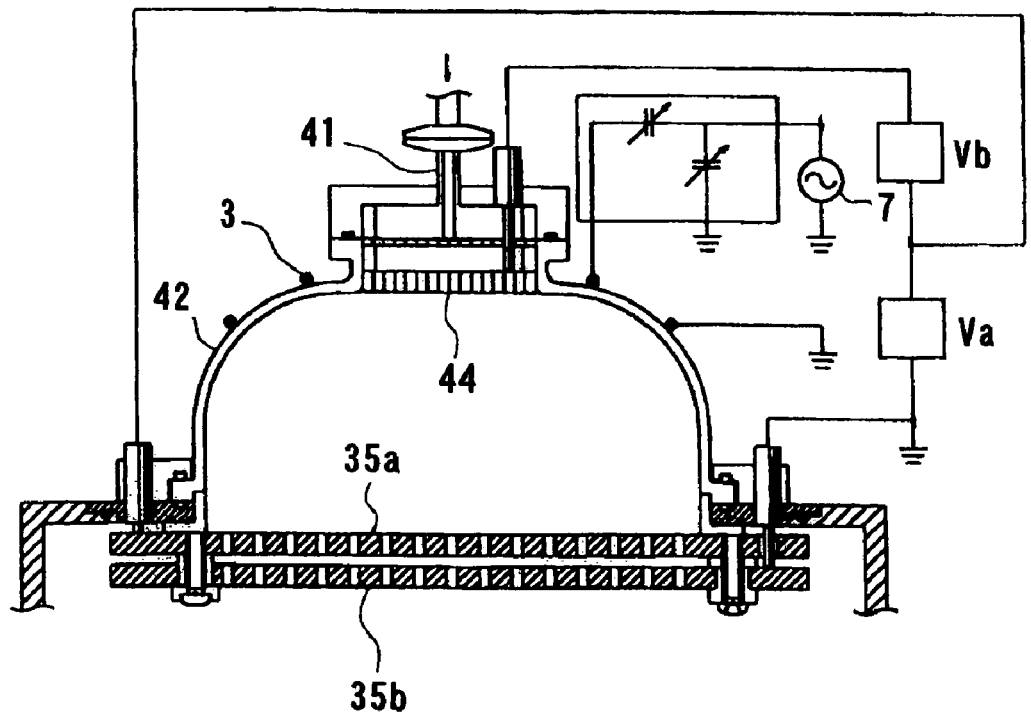
FIG. 5 is a schematic view showing a beam source according to a fifth embodiment of the present invention.

FIG. 5 is a schematic view showing a beam source according to a fifth embodiment of the present invention. The beam source in the fifth embodiment has a plasma potential adjustment electrode 44 in addition to two grid electrodes 35a and 35b. A gas is introduced from a gas inlet port 41 through holes formed in the plasma potential adjustment electrode 44 into a plasma generating chamber 42. When a voltage is applied to the plasma potential adjustment electrode 44, the plasma potential of positive and negative ions generated can be increased or decreased with respect to a potential of the first grid electrode 35a contacting the plasma. Therefore, ions can be accelerated and supplied between the two grid electrodes 35a and 35b. Accordingly, the beam source in the fifth embodiment can achieve an ion current density higher than that of the beam source shown in FIG. 4. Particularly, in this arrangement, a DC voltage Vb is set to be as low as about 50V such that the first grid electrode 35a is hardly sputtered, and ions are supplied between the grid electrodes 35a and 35b. Further, when a DC voltage Va of, for example, about 50 V is applied between the grid electrodes 35a and 35b, it is possible to achieve an ion beam having a high ion current density. At that time, the ion beam has a low energy of about 100 eV, which is a sum of the two voltages Va and Vb.

Figure 6:
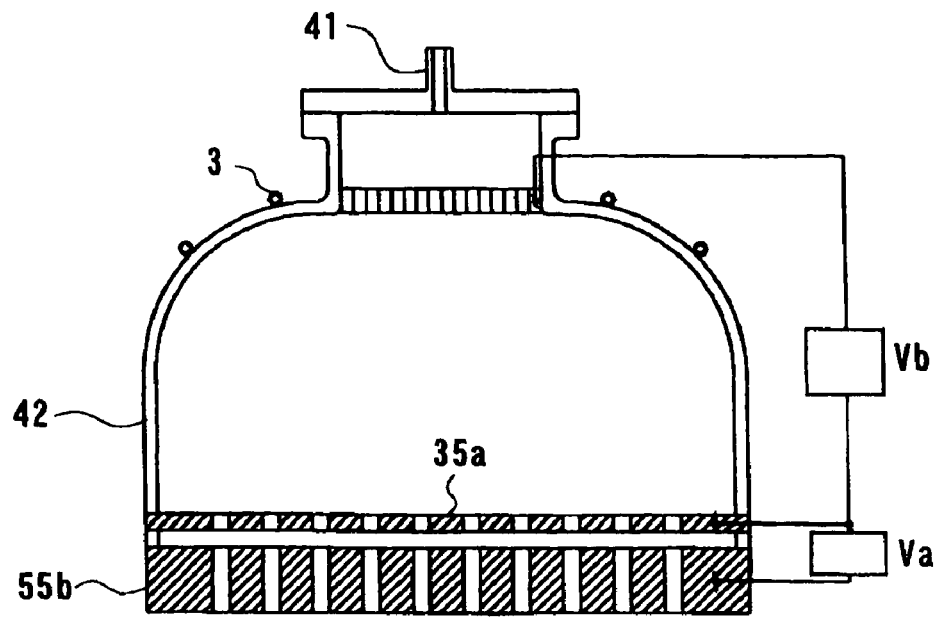
FIG. 6 is a schematic view showing a beam source according to a sixth embodiment of the present invention.

FIG. 6 is a schematic view showing a beam source according to a sixth embodiment of the present invention. The beam source in the sixth embodiment differs from the beam source shown in FIG. 5 in that a second grid electrode 55b is as thick as 10 mm. With this arrangement, most of ions that are passing through beam extraction holes in the second grid electrode 55b are collided with sidewall surfaces of the beam extraction holes and hence neutralized in the vicinity of solid sidewall surfaces of the beam extraction holes, or are collided with gas molecules remaining within the beam extraction holes and hence neutralized by charge exchange with the gas molecules. Specifically, the ions are converted into neutral particles. Thus, it is possible to obtain a high-density neutral particle beam having a low energy. While the beam source shown in FIG. 6 has basically the same structure as shown in FIG. 5, the second grid electrode 55b, which serves to extract a beam, has an aspect ratio of at least 10. As a matter of course, the beam source shown in FIGS. 1 through 4 may be applied to the present embodiment.

Figure 7:
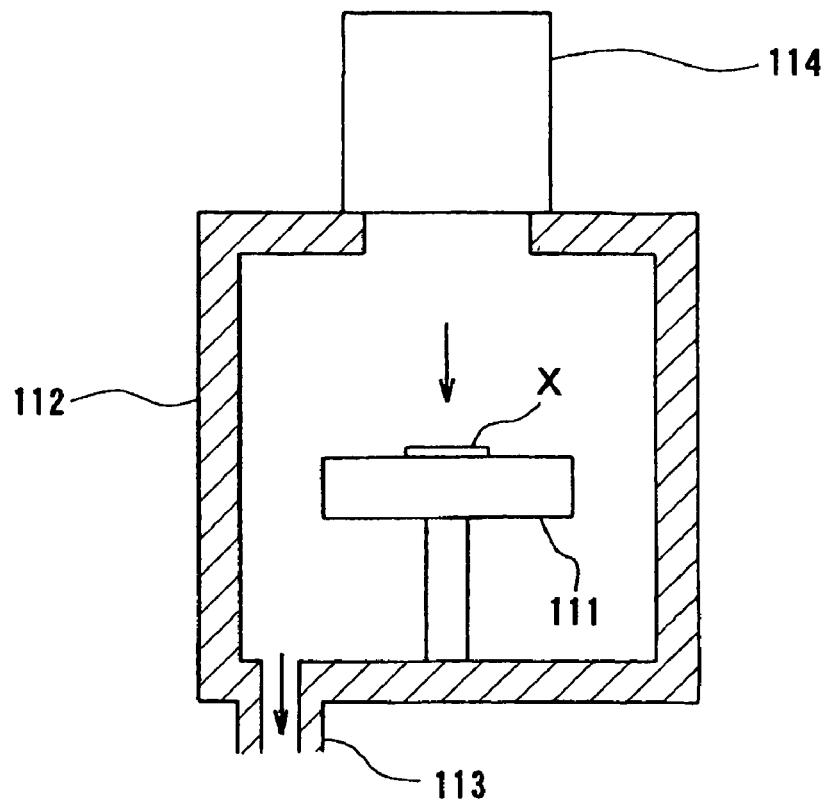
FIG. 7 is a schematic view showing a beam processing apparatus having a beam source according to the present invention.

FIG. 7 is a schematic view showing a beam processing apparatus using a beam source according to the present invention. The beam processing apparatus has a holding portion (holder) 111 for holding a workpiece X in a vacuum chamber 112. A workpiece X is placed on an upper surface of the holding portion 111. The vacuum chamber 112 has a gas outlet port 113 for discharging a gas from the vacuum chamber 112. The gas outlet port 113 is connected through a gas pipe (not shown) to a vacuum pump (not shown). The vacuum chamber 112 is maintained at a predetermined pressure by the vacuum pump. A high-density positive or negative ion beam having a low energy or a neutral particle beam, which is extracted from the beam source 114, travels linearly in the vacuum chamber 112 and is applied to the workpiece X placed on the holding portion 111 to thereby etch a surface of the workpiece X, clean a surface of the workpiece X, modify (e.g., nitride or oxidize) a surface of the workpiece X, or deposit a film on the workpiece X.

In this case, when the grid electrode in the beam source 114 has an aspect ratio as high as about 10 as in the sixth embodiment, the grid electrode serves not only to neutralize ions, but also to prevent a radiation produced by plasma from being applied to the workpiece X. Specifically, since the plasma generating chamber in which the plasma is generated is optically isolated from the workpiece X by the grid electrode, the radiation produced by the plasma is not substantially applied to the workpiece X. Therefore, it is possible to reduce adverse effects on the workpiece X due to radiation such as an ultraviolet ray which would otherwise damage the workpiece X.

Some charged particles may pass through the beam extraction holes in the grid electrode. In order to prevent such charged particles from being applied to the workpiece X, a deflector or an electron trap may be disposed downstream of the grid electrode. The deflector applies a voltage in a direction perpendicular to a beam traveling direction to change the traveling direction of charged particles to thereby prevent the charged particles from being applied to the workpiece X. The electron trap produces a magnetic field of about 100 gauss in a direction perpendicular to a beam traveling direction to change the traveling direction of electrons to thereby prevent the electrons from being applied to the workpiece X.

The beam source according to the present invention is practically advantageous as a high-density beam source having a low energy in that it draws high-density ions from high-density plasma directly to the grid electrode. In a beam source disclosed by Japanese laid-open patent publication No. 2001-28244, positional relationships of holes in a second mesh electrode are not the same as those in a third grid electrode, and the distance between the electrodes is as long as 10 to 30 mm. Therefore, ions accelerated by an applied voltage collide with a surface of the third grid electrode and thus ablate the third grid electrode by sputtering. According to the present invention, the centers of the holes in the two grid electrodes are aligned with each other. Therefore, a long period of time is required until the downstream electrode cannot be used any more by ablation. Thus, the beam source according to the present invention has an industrial advantage in that it can be operated for a long term.

In the above embodiments, the plasma is generated with use of a coil for ICP. However, the plasma may be generated with use of an electron cyclotron resonance source (ECR source), a coil for helicon wave plasma, a microwave, or the like. The frequency of the high-frequency voltage is not limited to 13.56 MHz and may be in a range from 1 MHz to 20 GHz.

As described above, according to the present invention, a beam, such as a positive ion beam, a negative ion beam, or a neutral particle beam, having a low energy and a high ion current density can be applied to a workpiece through a grid electrode with beam extraction holes having a diameter of at least 0.5 mm. Therefore, a workpiece can be processed at a high processing rate without any damage to circuits and crystal structures formed in the workpiece. In particular, since positive-negative ion plasma is employed to extract high-density ions, a grid electrode with holes having a diameter of at least 0.5 mm can be used. Therefore, the thickness of the grid electrode can be increased. Thus, it is possible to enhance a mechanical strength of the grid electrode. Accordingly, a beam source having a large diameter can be manufactured at low cost.

Further, when two adjacent grid electrodes, or a plasma potential adjustment electrode and two grid electrodes are employed, the energy of ions to collide with the grid electrode can be lowered without lowering the ion current density. Therefore, an ablation rate of the grid electrode by sputtering can be reduced so that the beam processing apparatus can be operated for a long term. Thus, it is possible to reduce cost for operation of the beam processing apparatus.

Although certain preferred embodiments of the present invention have been shown and described in detail, it should be understood that various changes and modifications may be made therein without departing from the scope of the appended claims.

What is claimed is:

1. A beam source comprising:
a plasma generating chamber;
a gas inlet port for introducing a gas into said plasma generating chamber;
a plasma generator for generating positive-negative ion plasma containing positive ions at a density of at least $10^{10}$ ions/cm$^3$ and negative ions from the gas;
a plasma potential adjustment electrode disposed in said plasma generating chamber;
a grid electrode having a plurality of beam extraction holes formed therein, said beam extraction holes having a size of at least 0.5 mm;
a first power supply for applying a voltage of at most 500 V between said plasma potential adjustment electrode and said grid electrode;
a coil disposed near said plasma generating chamber; and
a second power supply for intermittently supplying a high-frequency voltage to said coil.

2. The beam source as recited in claim 1, wherein said second power supply is configured to interrupt application of the high-frequency voltage for a period of time that is sufficiently longer than a period of time in which electrodes in the positive-negative ion plasma are attached to the gas to generate the negative ions and sufficiently shorter than a period of time in which an electron density in the positive-negative ion plasma is lowered to extinguish the positive-negative ion plasma and to apply the high-frequency voltage for a period of time that is long enough to recover an energy of the electrons in the positive-negative ion plasma which has been lowered during the interruption of the high-frequency voltage.

3. A beam source comprising:
a plasma generating chamber;
a gas inlet port for introducing a gas into said plasma generating chamber;
a plasma generator for generating positive-negative ion plasma containing positive ions and negative ions from the gas;
a plurality of grid electrodes each having a plurality of beam extraction holes formed therein;
a first power supply for applying a voltage between said plurality of grid electrodes to accelerate the positive ions or the negative ions so as to pass through said beam extraction holes formed in said grid electrodes and to extract a neutralized beam from the positive ions or the negative ions or an ion beam;
a coil disposed near said plasma generating chamber; and
a second power supply for intermittently supplying a high-frequency voltage to said coil.

4. The beam source as recited in claim 3, further comprising a plasma potential adjustment electrode disposed in said plasma generating chamber; and
a plasma potential adjustment power supply for applying a voltage between said plasma potential adjustment electrode and at least one of said grid electrodes.

5. The beam source as recited in claim 4, wherein said plasma potential adjustment power supply applies a low voltage such that accelerated ions do not practically sputter said at least one of said grid electrodes.

6. The beam source as recited in claim 3, wherein said plurality of beam extraction holes in said plurality of grid electrodes are aligned with each other.

7. The beam source as recited in claim 3, wherein said plurality of beam extraction holes in at least one of said grid electrodes has an aspect ratio of at least 10.

8. The beam source as recited in claim 3, wherein said second power supply is configured to interrupt application of the high-frequency voltage for a period of time that is sufficiently longer than a period of time in which electrons in the positive-negative ion plasma are attached to the gas to generate the negative ions and sufficiently shorter than a period of time in which an electron density in the positive-negative ion plasma is lowered to extinguish the positive-negative ion plasma and to apply the high-frequency voltage for a period of time that is long enough to recover an energy of the electrons in the positive-negative ion plasma which has been lowered during the interruption of the high-frequency voltage.

9. A beam processing apparatus comprising:
a vacuum chamber;
a holder disposed in said vacuum chamber for holding a workpiece; and
a beam source for applying a beam to the workpiece held by said holder, said beam source comprising:
a plasma generating chamber;
a gas inlet port for introducing a gas into said plasma generating chamber;
a plasma generator for generating positive-negative ion plasma containing positive ions at a density of at least $10^{10}$ ions/cm$^3$ and negative ions from the gas;
a plasma potential adjustment electrode disposed in said plasma generating chamber;
a grid electrode having a plurality of beam extraction holes formed therein, said beam extraction holes having a size of at least 0.5 mm;
a first power supply for applying a voltage of at most 500 V between said plasma potential adjustment electrode and said grid electrode;

a coil disposed near said plasma generating chamber; and
a second power supply for intermittently supplying a high-frequency voltage to said coil.

10. The beam processing apparatus as recited in claim 9, wherein said second power supply is configured to interrupt application of the high-frequency voltage for a period of time that is sufficiently longer than a period of time in which electrons in the positive-negative ion plasma are attached to the gas to generate the negative ions and sufficiently shorter than a period of time in which an electron density in the positive-negative ion plasma is lowered to extinguish the positive-negative ion plasma and to apply the high-frequency voltage for a period of time that is long enough to recover an energy of the electrons in the positive-negative ion plasma which has been lowered during the interruption of the high-frequency voltage.

11. A beam processing apparatus comprising:
a vacuum chamber;
a holder disposed in said vacuum chamber for holding a workpiece; and
a beam source for applying a beam to the workpiece held by said holder, said beam source comprising:
a plasma generating chamber;
a gas inlet port for introducing a gas into said plasma generating chamber;
a plasma generator for generating positive-negative ion plasma containing positive ions and negative ions from the gas;
a plurality of grid electrodes each having a plurality of beam extraction holes formed therein;
a first power supply for applying a voltage between said plurality of grid electrodes to accelerate the positive ions or the negative ions so as to pass through said beam extraction holes formed in said grid electrodes and to extract a neutralized beam from the positive ions or the negative ions or an ion beam;
a coil disposed near said plasma generating chamber; and
a second power supply for intermittently supplying a high-frequency voltage to said coil.

12. The beam processing apparatus as recited in claim 11, further comprising a plasma potential adjustment electrode disposed in said plasma generating chamber; and
a plasma potential adjustment power supply for applying a voltage between said plasma potential adjustment electrode and at least one of said grid electrodes.

13. The beam processing apparatus as recited in claim 12, wherein said a plasma potential adjustment power supply applies a low voltage such that accelerated ions do not practically sputter said at least one of said grid electrodes.

14. The beam processing apparatus as recited in claim 11, wherein said plurality of beam extraction holes in said plurality of grid electrodes are aligned with each other.

15. The beam processing apparatus as recited in claim 11, wherein said plurality of beam extraction holes in at least one of said grid electrodes has an aspect ratio of at least 10.

16. The beam processing apparatus as recited in claim 11, wherein said second power supply is configured to interrupt application of the high-frequency voltage for a period of time that is sufficiently longer than a period of time in which electrons in the positive-negative ion plasma are attached to the gas to generate the negative ions and sufficiently short than a period of time in which an electron density in the positive-negative ion plasma is lowered to extinguish the positive-negative ion plasma and to apply the high-frequency voltage for a period of time that is long enough to recover an energy of the electrons in the positive-negative ion plasma which has been lowered during the interruption of the high-frequency voltage.

17. A beam source comprising:
a plasma generating chamber;
a gas inlet port for introducing a gas into said plasma generating chamber;
a plasma generator for generating positive-negative ion plasma containing positive ions and negative ions from the gas;
a plurality of grid electrodes each having a plurality of beam extraction holes formed therein;
a first power supply for applying a voltage between said plurality of grid electrodes to accelerate the positive ions or the negative ions so as to pass through said beam extraction holes formed in said grid electrodes and to extract a neutralized beam from the positive ions or the negative ions or an ion beam;
a plasma potential adjustment electrode disposed in said plasma generating chamber; and
a plasma potential adjustment power supply for applying a voltage between said plasma potential adjustment electrode and at least one of said grid electrodes.

18. The beam source as recited in claim 17, wherein said plasma potential adjustment power supply applies a low voltage such that accelerated ions do not practically sputter said at least one of said grid electrodes.

19. The beam source as recited in claim 17, further comprising:
a coil disposed near said plasma generating chamber; and
a second power supply for intermittently supplying a high-frequency voltage to said coil.

20. The beam source as recited in claim 19, wherein said second power supply is configured to interrupt application of the high-frequency voltage for a period of time that is sufficiently longer than a period of time in which electrons in the positive-negative ion plasma are attached to the gas to generate the negative ions and sufficiently shorter than a period of time in which an electron density in the positive-negative ion plasma is lowered to extinguish the positive-negative ion plasma and to apply the high-frequency voltage for a period of time that is long enough to recover an energy of the electrons in the positive-negative ion plasma which has been lowered during the interruption of the high-frequency voltage.

21. A beam processing apparatus comprising:
a vacuum chamber;
a holder disposed in said vacuum chamber for holding a workpiece; and
a beam source for applying a beam to the workpiece held by said holder, said beam source comprising:
a plasma generating chamber;
a gas inlet port for introducing a gas into said plasma generating chamber;
a plasma generator for generating positive-negative ion plasma containing positive ions and negative ions from the gas;
a plurality of grid electrodes each having a plurality of beam extraction holes formed therein;
a first power supply for applying a voltage between said plurality of grid electrodes to accelerate the positive ions or the negative ions so as to pass through said beam extraction holes formed in said grid electrodes and to extract a neutralized beam from the positive ions or the negative ions or an ion beam;
a plasma potential adjustment electrode disposed in said plasma generating chamber; and a plasma potential adjustment power supply for applying a voltage between said plasma potential adjustment electrode and at least one of said grid electrodes.

22. The beam processing apparatus as recited in claim 21, wherein said plasma potential adjustment power supply applies a low voltage such that accelerated ions do not practically sputter said at least one of said grid electrodes.

23. The beam processing apparatus as recited in claim 21, further comprising:
a coil disposed near said plasma generating chamber; and
a second power supply for intermittently supplying a high-frequency voltage to said coil.

24. The beam processing apparatus as recited in claim 23, wherein said second power supply is configured to interrupt application of the high-frequency voltage for a period of time that is sufficiently longer than a period of time in which electrons in the positive-negative ion plasma are attached to the gas to generate the negative ions and sufficiently shorter than a period of time in which an electron density in the positive-negative ion plasma is lowered to extinguish the positive-negative ion plasma and to apply the high-frequency voltage for a period of time that is long enough to recover an energy of the electrons in the positive-negative ion plasma which has been lowered during the interruption of the high-frequency voltage.

* * * * *